(12) United States Patent
Cliff et al.

(10) Patent No.: US 6,366,121 B2
(45) Date of Patent: Apr. 2, 2002

(54) PROGRAMMABLE LOGIC ARRAY INTEGRATED CIRCUIT ARCHITECTURES

(75) Inventors: Richard G. Cliff, Milpitas; Francis B. Heile, Santa Clara; Joseph Huang, San Jose; Christopher F. Lane, Campbell; Fung Fung Lee, Milpitas; Cameron McClintock, Mountain View; David W. Mendel, Sunnyvale; Ninh D. Ngo; Bruce B. Pedersen, both of San Jose; Srinivas T. Reddy, Fremont; Chiakang Sung, Milpitas; Kerry Veenstra, San Jose; Bonnie I. Wang, Cupertino, all of CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/865,227

(22) Filed: May 25, 2001

Related U.S. Application Data

(63) Continuation of application No. 09/328,704, filed on Jun. 9, 1999, which is a division of application No. 08/807,561, filed on Feb. 28, 1997, now Pat. No. 5,963,049, which is a continuation-in-part of application No. 08/442,795, filed on May 17, 1995, now Pat. No. 5,689,195.
(60) Provisional application No. 60/021,449, filed on Jul. 10, 1996.

(51) Int. Cl.[7] .......................... G06F 7/38; H03K 19/177
(52) U.S. Cl. .......................................... 326/41; 326/39
(58) Field of Search ................................ 326/41, 38, 39

(56) References Cited

U.S. PATENT DOCUMENTS

| 3,473,160 A | 10/1969 | Wahlstrom | 340/172.5 |
| 4,609,986 A | 9/1986 | Hartmann et al. | 364/200 |
| 4,617,479 A | 10/1986 | Hartmann et al. | 307/465 |

(List continued on next page.)

FOREIGN PATENT DOCUMENTS

| EP | 461798 | 12/1991 | H03K/19/177 |
| GB | 2283602 | 5/1995 | H03K/19/177 |
| WO | WO 94/10754 | 5/1994 | H03K/19/177 |
| WO | WO 95/22205 | 8/1995 | H03K/19/177 |

OTHER PUBLICATIONS

R. C. Minnick, "A Survey of Microcellular Research," Journal of the Association for Computing Machinery, vol. 14, No. 2, pp. 203–41, Apr. 1967.

(List continued on next page.)

Primary Examiner—Michael Tokar
Assistant Examiner—David D. Chang
(74) Attorney, Agent, or Firm—Fish & Neave; Robert R. Jackson

(57) ABSTRACT

A programmable logic array integrated circuit device has a plurality of regions of programmable logic disposed on the device in a two-dimensional array of intersecting rows and columns of regions. The output signals of several regions share a group of drivers for applying region output signals to interconnection conductors that convey signals between regions. This conserves driver resources and increases signal routing flexibility. Various approaches can be used for configuring the interconnection conductors to also conserve interconnection conductor resources. Logic regions may be used to directly drive specific input/output cells, thereby simplifying signal routing to the I/O cells and also possibly simplifying the structure of the I/O cells (e.g., by allowing certain I/O cell functions to be performed in the associated logic region). Region output signal routing flexibility may also be enhanced to facilitate simultaneous performance of combinatorial logic and a separate "lonely register" function in modules of the regions.

16 Claims, 18 Drawing Sheets

U.S. PATENT DOCUMENTS

| | | | |
|---|---|---|---|
| 4,642,487 A | 2/1987 | Carter | 307/465 |
| 4,677,318 A | 6/1987 | Veenstra | 307/465 |
| 4,713,792 A | 12/1987 | Hartmann et al. | 364/900 |
| 4,758,745 A | 7/1988 | Elgamel et al. | 307/465 |
| 4,774,421 A | 9/1988 | Hartmann et al. | 307/465 |
| 4,871,930 A | 10/1989 | Wong et al. | 307/465 |
| 4,899,067 A | 2/1990 | So et al. | 307/465 |
| 4,912,342 A | 3/1990 | Wong et al. | 307/465 |
| 5,023,606 A | 6/1991 | Kaplinsky | 340/825.8 |
| 5,073,729 A | 12/1991 | Greene et al. | 307/465.1 |
| 5,121,006 A | 6/1992 | Pedersen | 307/465 |
| 5,122,685 A | 6/1992 | Chan et al. | 307/465.1 |
| 5,132,571 A | 7/1992 | McCollum et al. | 307/465.1 |
| 5,144,166 A | 9/1992 | Camarota et al. | 307/465.1 |
| 5,208,491 A | 5/1993 | Ebeling et al. | 307/465 |
| 5,220,214 A | 6/1993 | Pedersen | 307/465 |
| RE34,363 E | 8/1993 | Freeman | 307/465 |
| 5,258,668 A | 11/1993 | Cliff et al. | 307/465 |
| 5,260,610 A | 11/1993 | Pedersen et al. | 307/465 |
| 5,260,611 A | 11/1993 | Cliff et al. | 307/465 |
| 5,274,581 A | 12/1993 | Cliff et al. | 364/784 |
| 5,350,954 A | 9/1994 | Patel | 307/465 |
| 5,371,422 A * | 12/1994 | Patel et al. | 326/41 |
| 5,448,186 A | 9/1995 | Kawata | 326/41 |
| 5,457,410 A | 10/1995 | Ting | 326/41 |
| 5,469,003 A | 11/1995 | Kean | 326/41 |
| 5,483,178 A | 1/1996 | Costello et al. | 326/41 |
| 5,509,128 A | 4/1996 | Chan | 395/311 |
| 5,543,732 A | 8/1996 | McClintock et al. | 326/41 |
| 5,565,793 A * | 10/1996 | Pedersen | 326/41 |
| 5,670,895 A * | 9/1997 | Kazarian et al. | 326/39 |
| 5,689,195 A | 11/1997 | Cliff et al. | 326/41 |
| 5,705,939 A | 1/1998 | McClintock et al. | 326/41 |
| 5,764,080 A | 6/1998 | Huang et al. | 326/41 |
| 5,872,463 A | 2/1999 | Pedersen | 326/41 |
| 5,909,126 A | 6/1999 | Cliff et al. | 326/41 |

OTHER PUBLICATIONS

S. E. Wahlstrom, "Programmable Logic Arrays –Cheaper by the Millions,"Electronics, Dec. 11, 1967, pp. 90–95.

*Recent Developments in Switching Theory*, A Mukhopadhyay, ed., Academic Press, New York, 1971, chapters VI and IX, pp. 229–254 and 369–422.

El Gamal et al., "An Architecture for Electrically Configurable Gate Arrays," IEEE Journal of Solid–State Circuits, vol. 24, No. 2, Apr. 1989, pp. 394–98.

El–Ayat et al., "A CMOS Electrically Configurable Gate Array," IEEE Journal of Solid–State Circuits, vol. 24, No. 3, Jun. 1989, pp. 752–62.

"*XC5000 Logic Cell Array Family, Technical Data*, Advance Information, " Xilinx, Inc., Feb. 1995.

*The Programmable Gate Array Data Book*, 1988, Xilinx, Inc., San Jose, CA (see especially page 2–12.

*ACT Family Field Programmable Gate Array Databook*, Apr. 1992, Actel Corporation, Sunnyvale, Ca, pp. 1–35 through 1–44.

*The Programmable Logic Data Book*, 1994, Xilinx, Inc., San Jose, CA, pp. 2–7, 2–12, and 2–13.

* cited by examiner

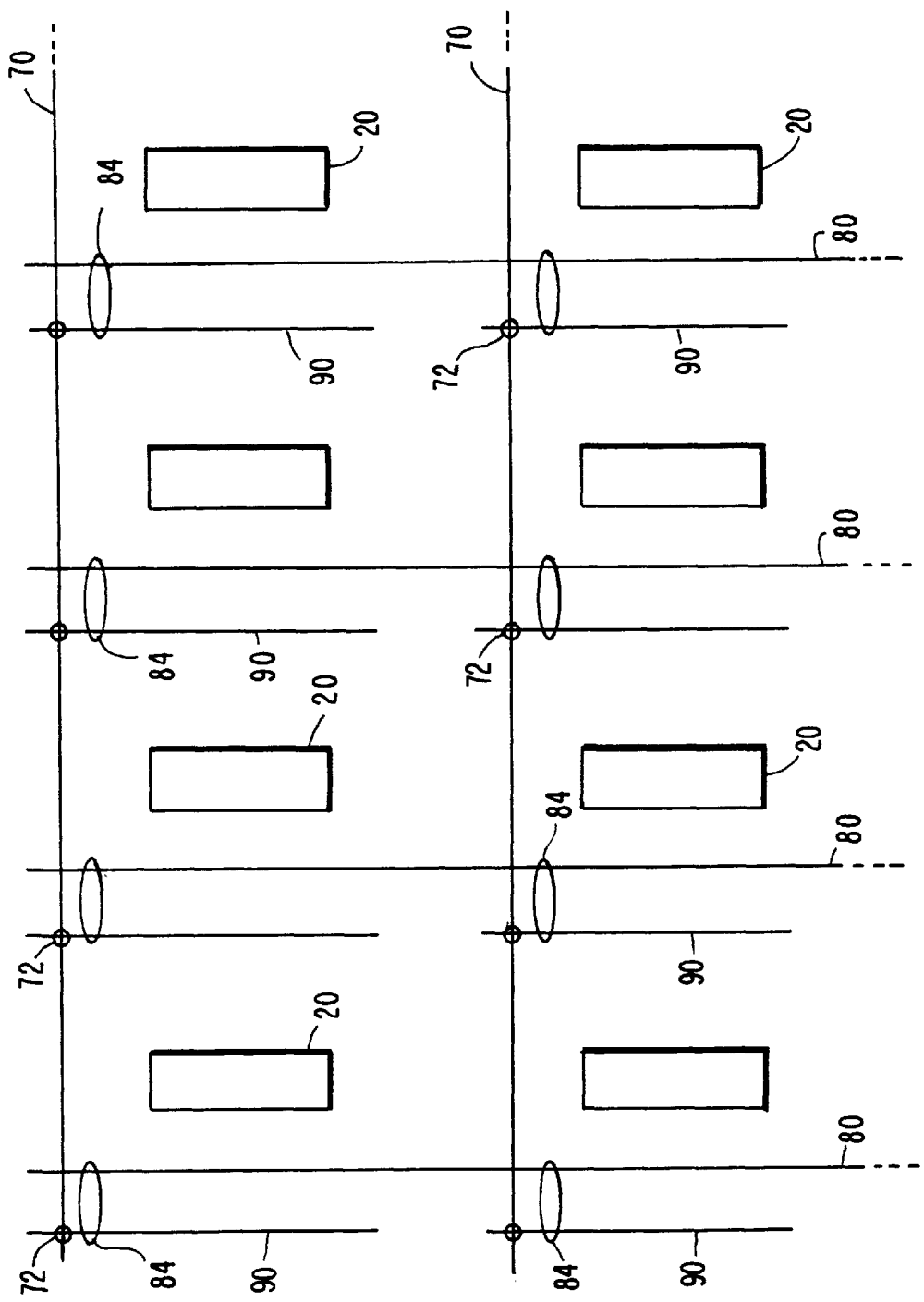

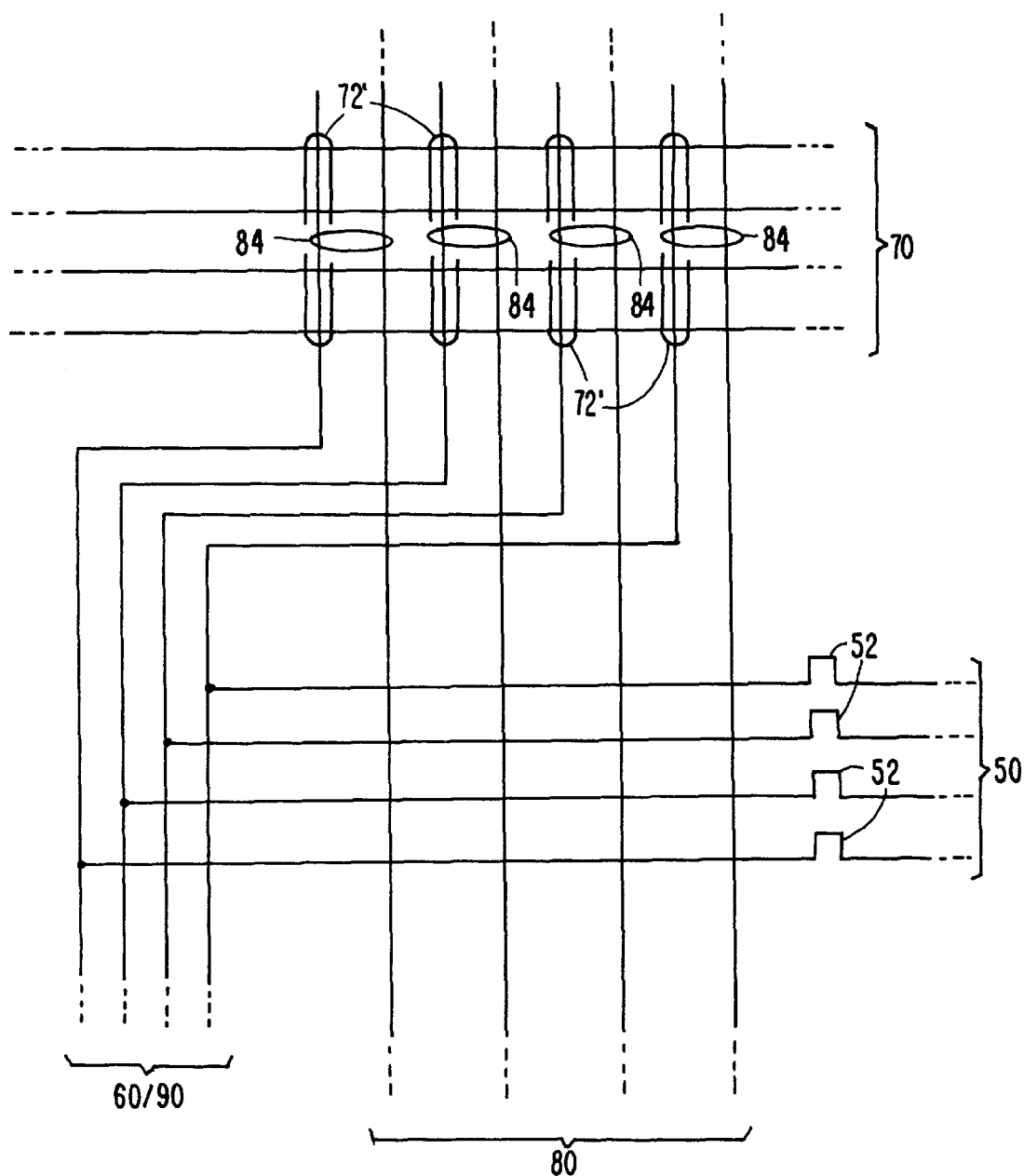

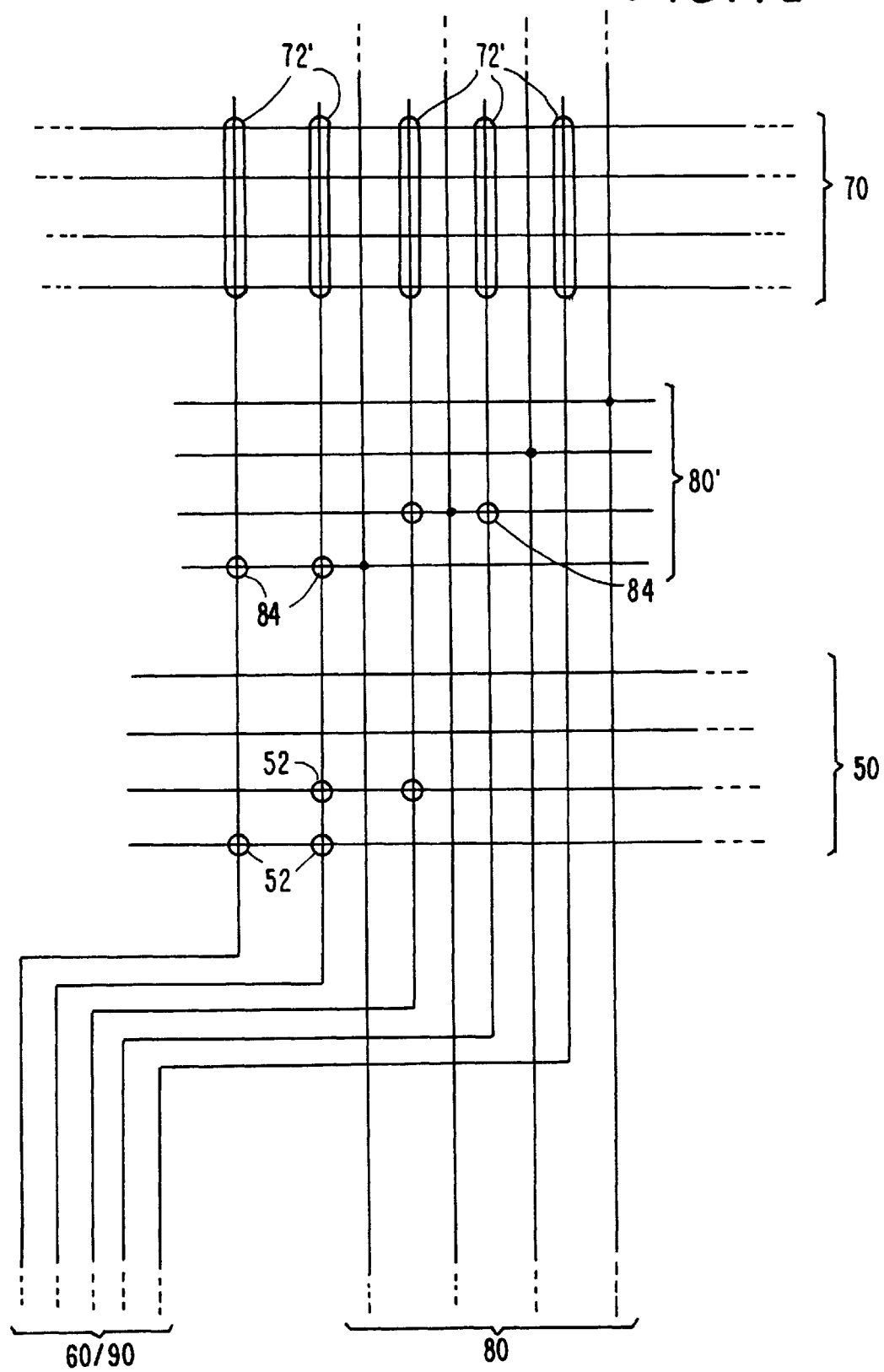

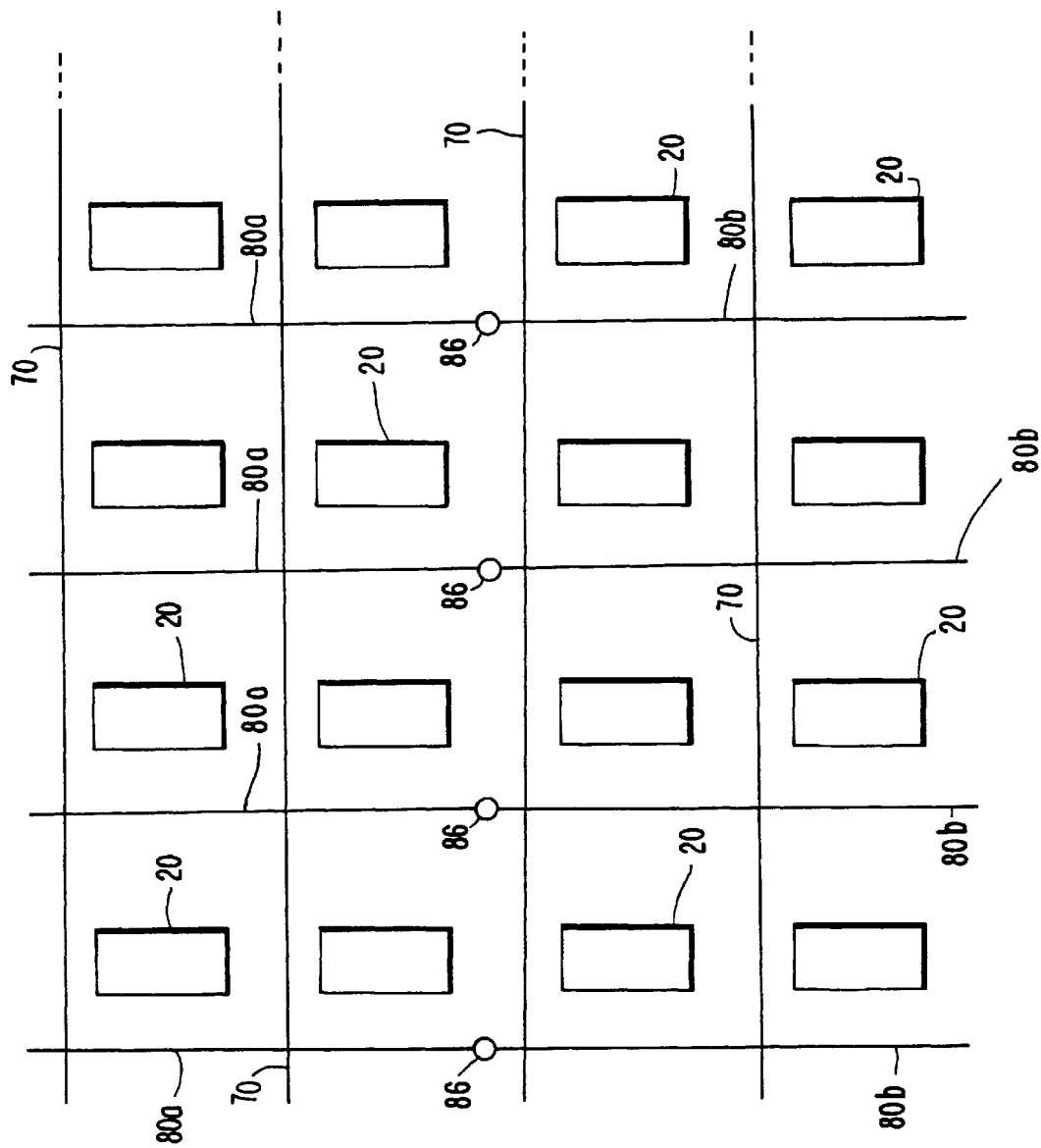

PROGRAMMABLE LOGIC ARRAY INTEGRATED CIRCUIT ARCHITECTURES

CROSS REFERENCE TO RELATED APPLICATIONS

This is a continuation of U.S. patent application Ser. No. 09/328,704, filed Jun. 9, 1999, which is a division of U.S. patent application Ser. No. 08/807,561, filed Feb. 28, 1997 (now U.S. Pat. No. 5,963,049), which is a continuation-in-part of U.S. patent application Ser. No. 08/442,795, filed May 17, 1995 (now U.S. Pat. No. 5,689,195) and which claims the benefit of U.S. provisional patent application No. 60/021,449, filed Jul. 10, 1996. All of these prior applications are hereby incorporated by reference herein in their entireties.

BACKGROUND OF THE INVENTION

This invention relates to programmable logic array integrated circuit devices, and more particularly to the manner in which such devices are organized.

Programmable logic array integrated circuit devices are well known, as is shown, for example, by Cliff et al. U.S. Pat. No. 5,260,611 and Cliff et al. U.S. Pat. No. 5,689,195, both of which are hereby incorporated by reference herein. Typical devices of these general kinds include a plurality of regions of programmable logic, each region being programmable to perform any of a plurality of relatively elementary logic functions on input signals applied to the region. A network of interconnection conductors is also provided on the device for programmably conveying signals to, from, and between the logic regions. By interconnecting the logic regions in various ways, the elementary logic functions performed by the individual regions can be concatenated to perform very complex logic.

The basic logic of the logic regions may be look-up table logic (as is discussed for the most part in the two references mentioned above), product term type logic (as is discussed for the most part in Wong et al. U.S. Pat. No. 4,871,930 (which is also hereby incorporated by reference herein)), or any other suitable type of logic. Any of these technologies may be used in the devices of this invention.

Programmable logic devices are usually intended as general-purpose devices. The designer of the device therefore does not know how much circuitry to provide for interconnecting the logic regions of the device. Some users may require large amounts of interconnection resources, while other users may require smaller amounts of such resources. Although it is theoretically possible to provide completely universal interconnection resources (which would allow any connection to be made no matter what other connections were also required), that is generally regarded as wasteful because only a small fraction of such completely universal interconnection resources are ever likely to be used. Thus one of the problems that the designer of programmable logic devices must deal with is to devise interconnection resources that are sufficient to meet the needs of most probable applications of the device without being wastefully more than will generally be needed. It is also important to avoid requirements for passing signals through large numbers of interconnection elements because such elements tend to slow down signal transmission and therefore reduce the operating speed of the device.

In view of the foregoing, it is an object of this invention to provide improved interconnection resources for programmable logic array integrated circuit devices.

It is a more particular object of the invention to provide interconnection resources for programmable logic array integrated circuit devices that provide a high degree of interconnection flexibility at relatively low cost in terms of "overhead" such as space occupied by interconnection conductors, programmable interconnections and the programmable elements required to control them, etc.

SUMMARY OF THE INVENTION

These and other objects of the invention are accomplished in accordance with the principles of the invention by grouping region output signals in groups of such signals, each of which groups has associated drivers for selectively applying signals to interconnection conductors of the device. Each driver can output any of the associated region output signals. This sharing of several drivers by several region output signals conserves driver resources and increases output signal routing flexibility.

The regions are disposed on the device in a two-dimensional array of intersecting rows and columns of regions. Horizontal interconnection conductors are associated with and extend along each row of regions. Vertical interconnection conductors are associated with and extend along each column of regions. Region-feeding conductors are provided for bringing signals into each region. Direct programmable connections are provided from both the horizontal and vertical conductors adjacent to a region to the region-feeding conductors associated with that region to avoid the need to route signals from a vertical conductor, for example, to a horizontal conductor and then to a region-feeding conductor.

Vertical conductors may be segmented and provided with programmable interconnections between the segments so that each segment can be used separately to provide a relatively short interconnection, or so that two (or more) segments can be interconnected to provide one relatively long interconnection.

If the device has only a relatively small number of rows, each region output in each column may have its own dedicated vertical conductor, thereby eliminating the need for tri-state driving of the vertical conductors.

In a device with a column of random access memory ("RAM") usable by the user of the device (in addition to the previously described columns of programmable logic regions), greater use may be made of the vertical conductors associated with the RAM column by connecting those vertical conductors to the horizontal conductors of the device in such a way as to render the RAM column vertical conductors usable as alternate paths for transmitting signals between the rows of the device.

To simplify the structure for routing signals to input/output ("I/O") cells of the device, each I/O cell may always be driven directly by a particular subregion of a particular region. This may also allow the structure of the I/O cells to be simplified by performing some I/O cell functions in the associated subregions.

An additional function for the region-feeding conductors may be to make programmable connections between various segments of segmented horizontal conductors.

To facilitate use of subregions for both combinatorial logic and to perform a separate "lonely-register" function, both a combinatorial output and a registered output of each subregion may be connectable to conductors which can provide local or global interconnections.

Further features of the invention, its nature and various advantages will be more apparent from the accompanying drawings and the following detailed description of the preferred embodiments.

BRIEF DESCRIPTION OF THE DRAWINGS

FIG. 6 is a more simplified depiction of a structure which can be generally like that shown in FIG. 1, with another possible feature of the invention added.

FIG. 7b is similar to FIG. 7a, but shows another illustrative way of providing the feature of FIG. 6.

FIG. 7d is again similar to FIG. 7a, but shows yet another illustrative way in which the feature of FIG. 6 can be provided.

FIG. 8 is another more simplified depiction of a structure which can be generally like that shown in FIG. 1, with still another possible feature of the invention added.

DETAILED DESCRIPTION OF THE PREFERRED EMBODIMENTS

Figure 1:
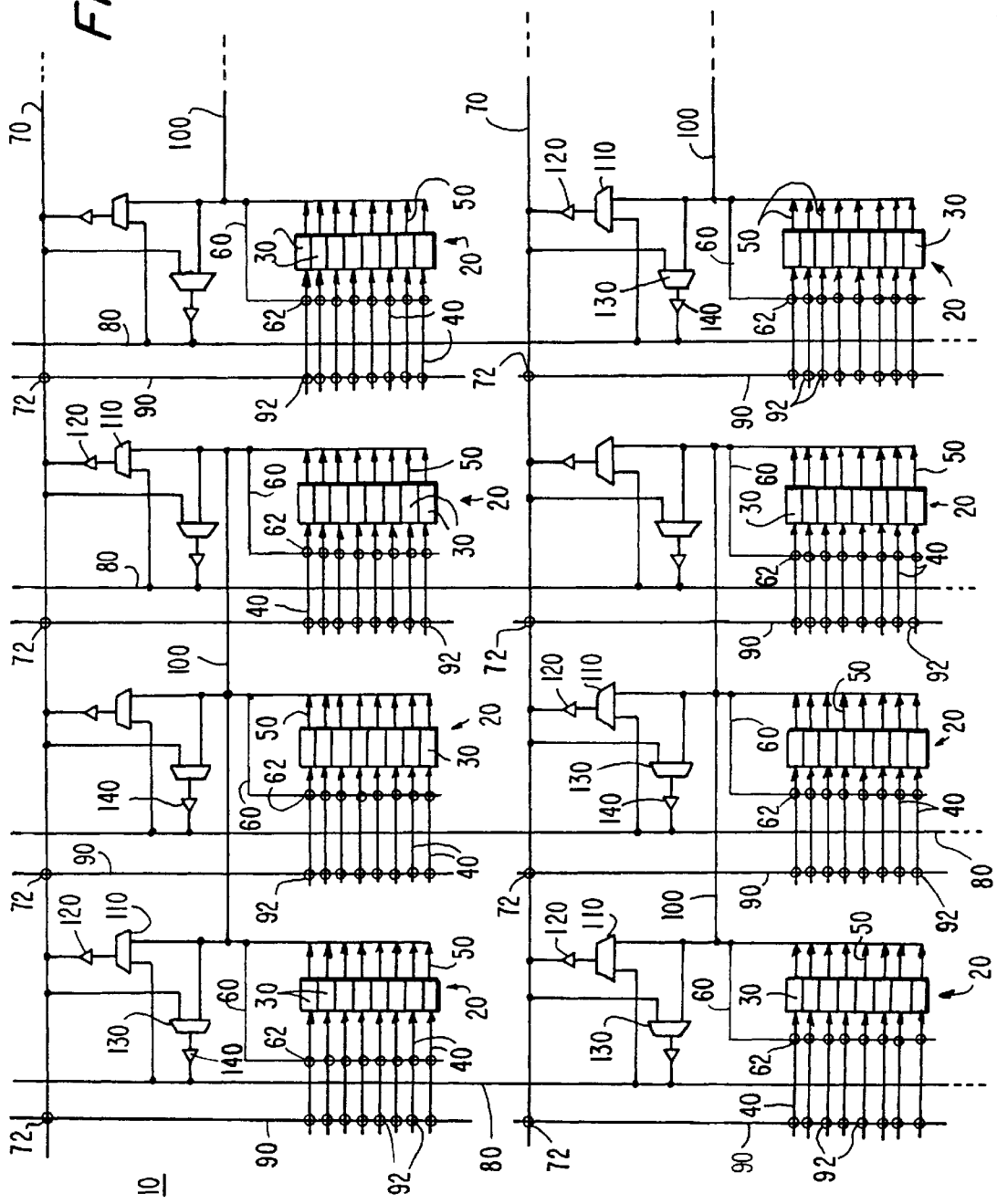
FIG. 1 is a simplified schematic block diagram of a representative portion of an illustrative embodiment of a programmable logic array integrated circuit device constructed in accordance with this invention.

A representative portion of an illustrative embodiment of a programmable logic array integrated circuit device 10 constructed in accordance with this invention is shown in FIG. 1. Device 10 includes a plurality of regions 20 of programmable logic disposed on the device in a plurality of intersecting rows and columns of such regions. Each region 20 includes a plurality of subregions 30 of programmable logic. In particular, in the depicted embodiment there are eight subregions 30 in each region 20. Each subregion 30 receives a plurality of input signals on input leads 40 and is programmable to perform any of a plurality of logic functions on those input signals. For example, each subregion 30 may include a look-up table which is programmable to provide any logical combination of four inputs 40 applied to the subregion. Each subregion 30 may produce an output signal 50 which can be fed back to the inputs 40 of the associated region 20 via conductors 60. Programmable logic connectors ("PLCs") 62 preferably allow any or substantially any conductor 60 associated with a region 20 to be connected to any or substantially any conductor 40 associated with that region.

A plurality of horizontal interconnection conductors 70 is associated with each row of regions 20. Some of conductors 70 (elsewhere identified as conductors 70a) extend along the entire length of the associated row and are therefore sometimes referred to as global horizontal ("GH") conductors. Others of conductors 70 (elsewhere identified as conductors 70b) extend along only either the left or right half of the associated row and are therefore sometimes referred to as half horizontal ("HH") conductors.

A plurality of vertical interconnection conductors 80 is associated with each column of regions 20. In the embodiment shown in FIG. 1 conductors 80 extend the entire length of the associated column and are therefore sometimes referred to as global vertical ("GV") conductors.

A plurality of region-feeding conductors 90 is associated with each of regions 20. The region-feeding conductors 90 associated with each region 20 are programmably connectable by PLCs 72 to the horizontal conductors 70 associated with the row that includes that region. Only a partial population of PLCs 72 is preferably provided. For example, associated with each region 20 each conductor 70 may be connectable to any of several, but substantially less than all, conductors 90. Correspondingly, each conductor 90 may receive a signal from any of several, but substantially less than all, conductors 70. The conductors 90 associated with each region 20 are programmably connectable by PLCs 92 to the conductors 40 of that region. Like PLCs 62, the population of each group of PLCs 92 is preferably a full or substantially full population (i.e., any or substantially any conductor 90 is connectable to any or substantially any intersecting conductor 40). The conductors 90 associated with each region 20 (in cooperation with the associated PLCs 72 and 92 and conductors 40) therefore allow signals on the associated conductors 70 to be applied to the inputs of that region.

In addition to being fed back locally via conductors 60, the output signals 50 of each region are applied to relatively short horizontal conductors 100. In the embodiment shown in FIG. 1 horizontal conductors 100 extend across three adjacent columns of regions 20. Thus the columns of regions 20 are grouped in groups of three adjacent columns, each such group having associated conductors 100. On the assumption that there are 24 columns of regions 20, conductors 100 are sometimes referred to as eighth horizontal ("EH") conductors.

The signals on conductors 100 can be applied to the associated conductors 70 via PLCs 110 and drivers 120. PLCs 110 can be alternatively controlled to apply signals on associated conductors 80 to drivers 120 and thus to conductors 70. The signals on conductors 100 can be applied to the associated conductors 80 via PLCS 130 and drivers 140.

PLCs 130 can be alternatively controlled to apply signals on associated conductors 70 to drivers 140 and thus to conductors 80. Drivers 120 and 140 are preferably programmably controlled tri-state drivers. Drivers 120 and 140 are therefore also PLCs.

Figure 2:
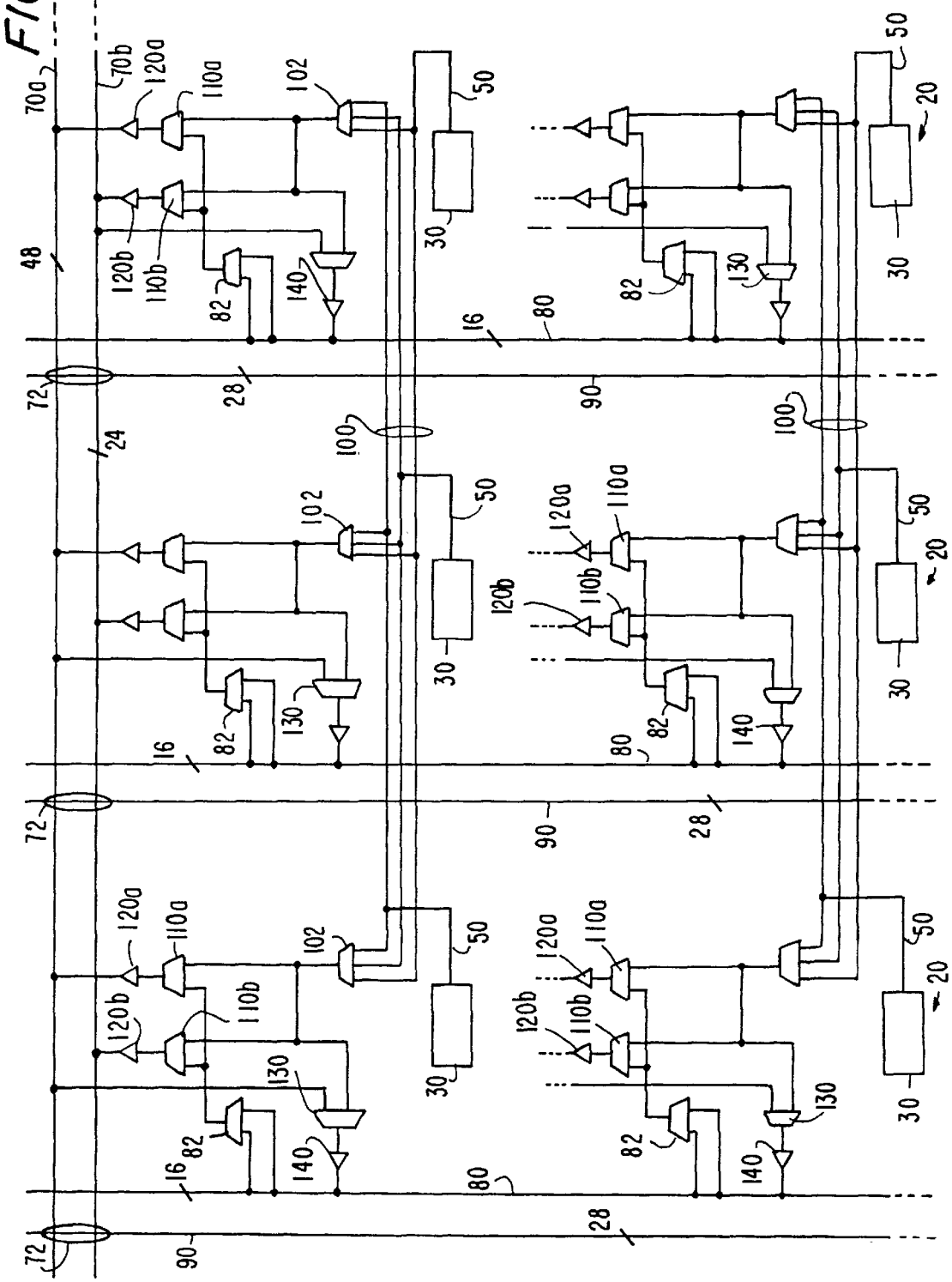
FIG. 2 is a simplified schematic block diagram showing a representative portion of the device of FIG. 1 in more detail.

FIG. 2 shows a representative portion of FIG. 1 in somewhat more detail to better depict the nature and extent of resources 100, 110, 120, 130, and 140. To avoid overcrowding the drawing, FIG. 2 does not show conductors 40 and 60. As shown in the upper portion of FIG. 2, each of three horizontally adjacent subregions 30 applies its output signal 50 to a respective one of three conductors 100 that span the three regions 20 that include those subregions. Associated with each of these subregions is a PLC 102 that can select the signal on any one of the associated conductors 100. The output signal of each PLC 102 is applied to one input terminal of each of two associated PLCs 110 and one associated PLC 130. The other input to each pair of PLCs 110 is a signal from one of two vertical conductors 80 that are associated with the column that includes that pair of PLCs 110. This one-of-two selection is made by an associated PLC 82. The other input to each PLC 130 is a signal from a GH conductor 70a or an HH conductor 70b associated with the row that includes that PLC 130. Each PLC 110 selects one of its two input signals for application to an associated driver 120 (preferably a programmable tri-state driver). The output signal of each driver 120 is applied to one of the associated horizontal conductors 70. Similarly, each PLC 130 selects one of its two input signals for application to an associated driver 140 (again preferably a programmable tri-state device and therefore itself a PLC). The output signal of each driver 140 is applied to one of the associated column conductors 80.

The interconnection structure shown in the upper portion of FIG. 2 is repeated for all other subregions 30 in the three horizontally adjacent regions 20 that are grouped with one another by conductors 100. For example, the lower portion of FIG. 2 shows this interconnection structure for the next three subregions 30 down from the above-described subregions. In the lower portion of FIG. 2 the connections from drivers 120 to horizontal conductors 70 are not expressly shown, but they are in fact completed. Similarly, the connections from horizontal conductors 70 to PLCs 130 are not expressly shown, but these connections are also in fact completed.

From the foregoing, it will be apparent that each group of conductors 100 and associated PLCs allows the subregions 30 that output to those conductors to share a relatively large number of drivers 120 and 140. In this way each subregion output 50 is given a large number of ways out to horizontal conductors 70 and/or to vertical conductors 80. In particular, each subregion output 50 can get to any of six drivers 120 and thus to any of six horizontal conductors 70 (assuming that each driver 120 associated with a group of three conductors 100 connects to a different one of the associated horizontal conductors 70). Similarly, each subregion output 50 can get to any of three drivers 140, and moreover these three drivers 140 connect to vertical conductors 80 associated with three different columns of regions 20. The interconnection structure thus shown and described greatly increases output routing flexibility for the subregion outputs, and it does so without increasing the requirement for driver resources (such as drivers 120 and 140). It is generally desirable to conserve driver resources because drivers tend to be relatively large and therefore space-, power-, and signal-propagation-time-consuming. In addition, the ability to use conductors 100 to convey a subregion output signal 50 to a vertical conductor 80 associated with another column may help to conserve use of horizontal conductor 70 resources for such purposes.

Because drivers 120 and 140 are effectively shared as described above, it may be possible to reduce the number of drivers relative to the number of subregion output signals 50. For example, instead of having three drivers 120a (to GH conductors 70a) and three drivers 120b (to HH conductors 70b) for each group of three subregions 30, it may be possible to have only two drivers 120a and two drivers 120b for each group of three subregions.

Figure 3:
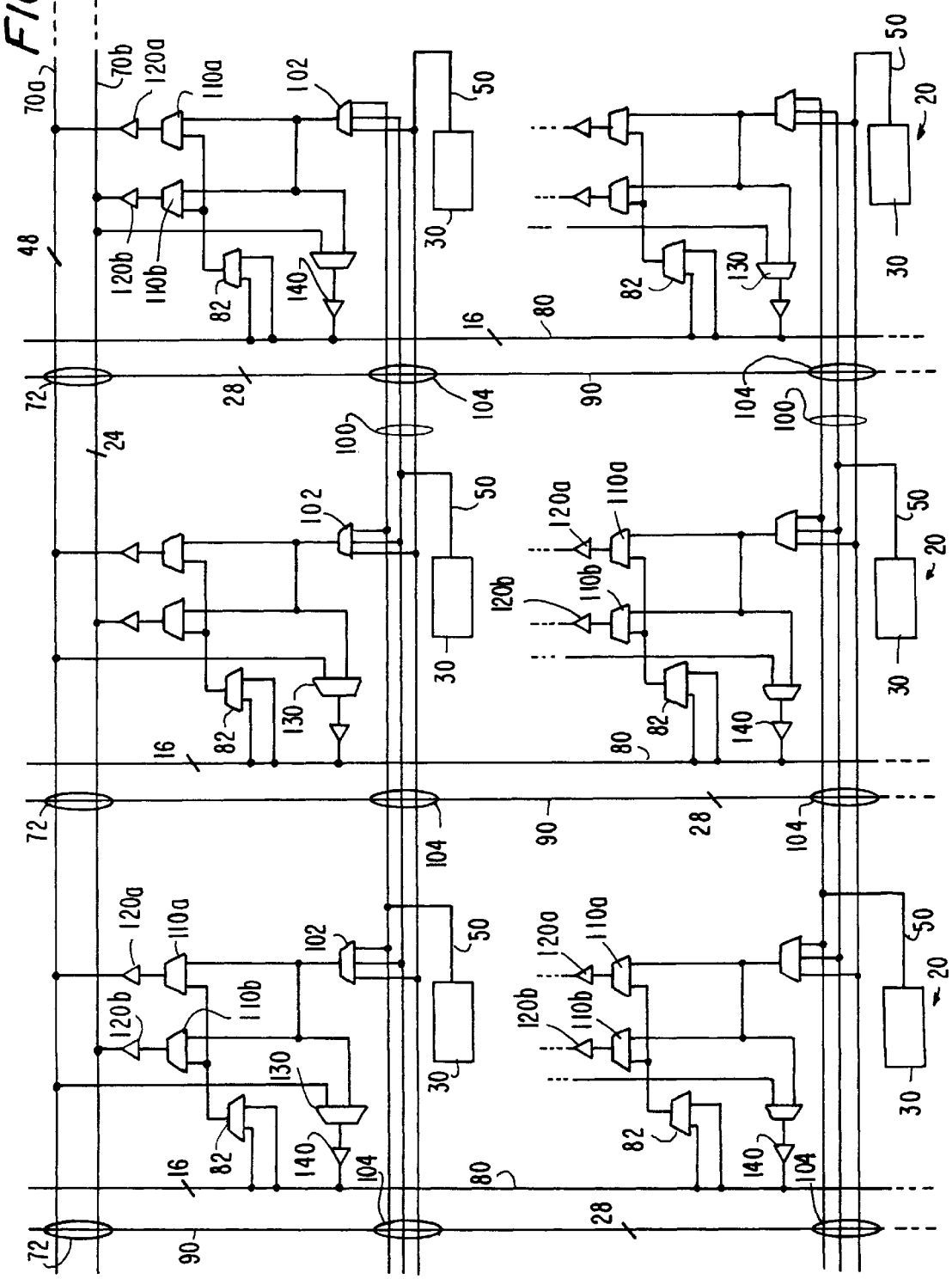
FIG. 3 is similar to FIG. 2, but shows an alternative embodiment of the invention.

FIG. 3 shows a possible extension of the concept underlying FIGS. 1 and 2. In the alternative embodiment shown in FIG. 3 conductors 100 are additionally programmably connectable (by PLCs 104) to selected conductors 90 associated with the three regions 20 that are served by those conductors 100. This allows any subregion output 50 in a group of three regions 20 to be applied to the region-feeding conductors 90 of any region in that group without having to use a relatively long horizontal conductor 70 to make such a relatively short horizontal connection. This may help further conserve the longer horizontal conductor resources represented by conductors 70. In other respects the embodiment shown in FIG. 3 may be similar to the embodiment shown in FIGS. 1 and 2.

It is preferably not necessary for each conductor 100 to be connectable to all intersected conductors 90 via PLCs 104. Instead, only a partial population of PLCs 104 may be provided. For example, each conductor 100 may be connectable by PLCS 104 to two conductors 90 associated with each region 20 in the group with which that conductor 100 is associated.

Figure 4:
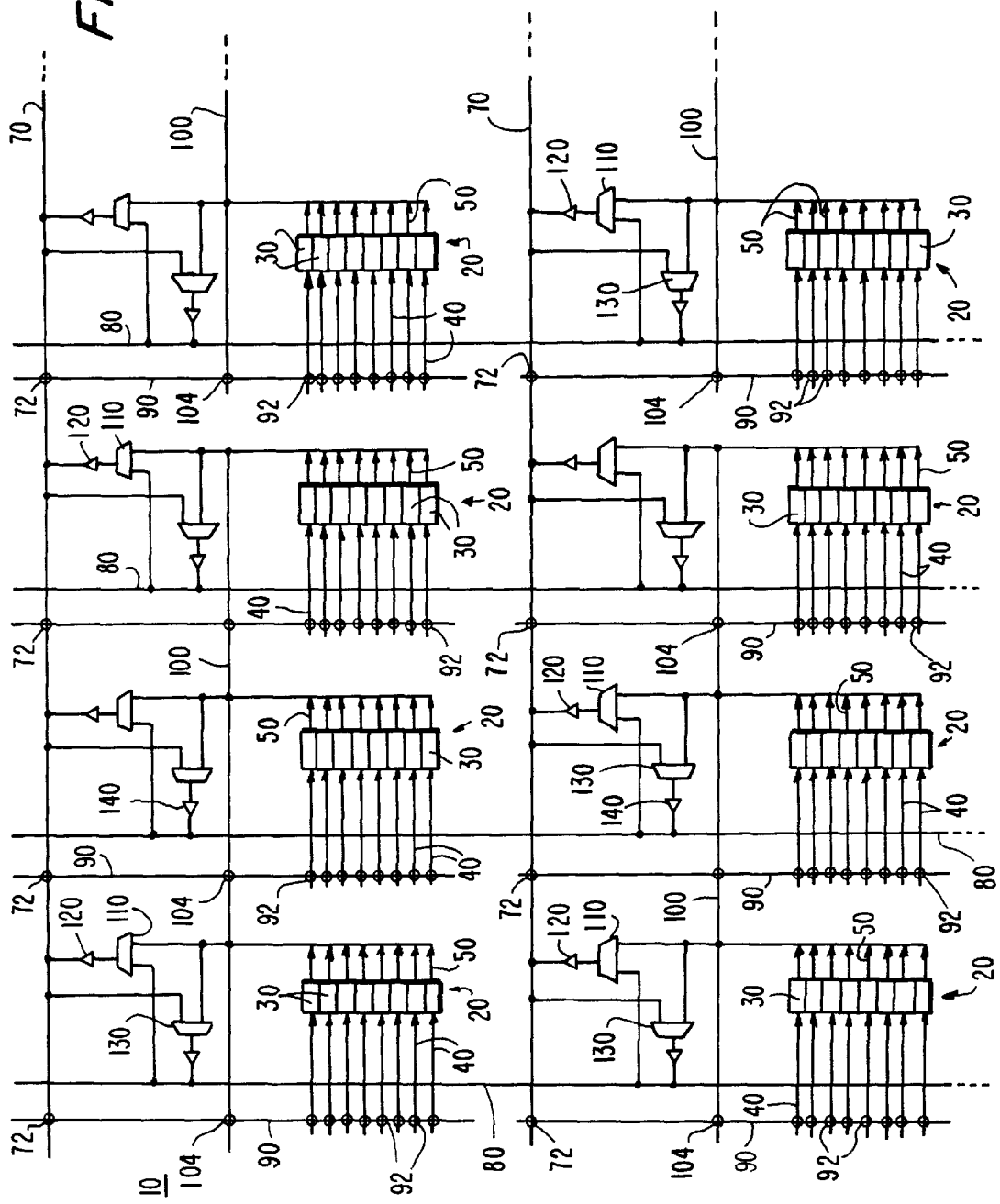
FIG. 4 is similar to FIG. 1, but shows another alternative embodiment of the invention.

FIG. 4 shows a possible further extension of the concepts illustrated by FIG. 3. In the illustrative embodiment shown in FIG. 4 dedicated local feedback conductor 60 and their associated PLCs 62 are eliminated. Instead, conductors 100 and associated PLCs 104 (as in FIG. 3) are used for all local feedback (as well as for such additional purposes as have been described above in connection with FIGS. 1–3).

Although FIGS. 1–4 show regions 30 grouped by conductors 100 in groups of three, it will be understood that any level of segmentation can be employed. For example, regions 20 can be grouped in groups of four, five, or more by conductors 100 spanning such groups. Larger groups generally necessitate larger numbers of conductors 100.

Figure 5:
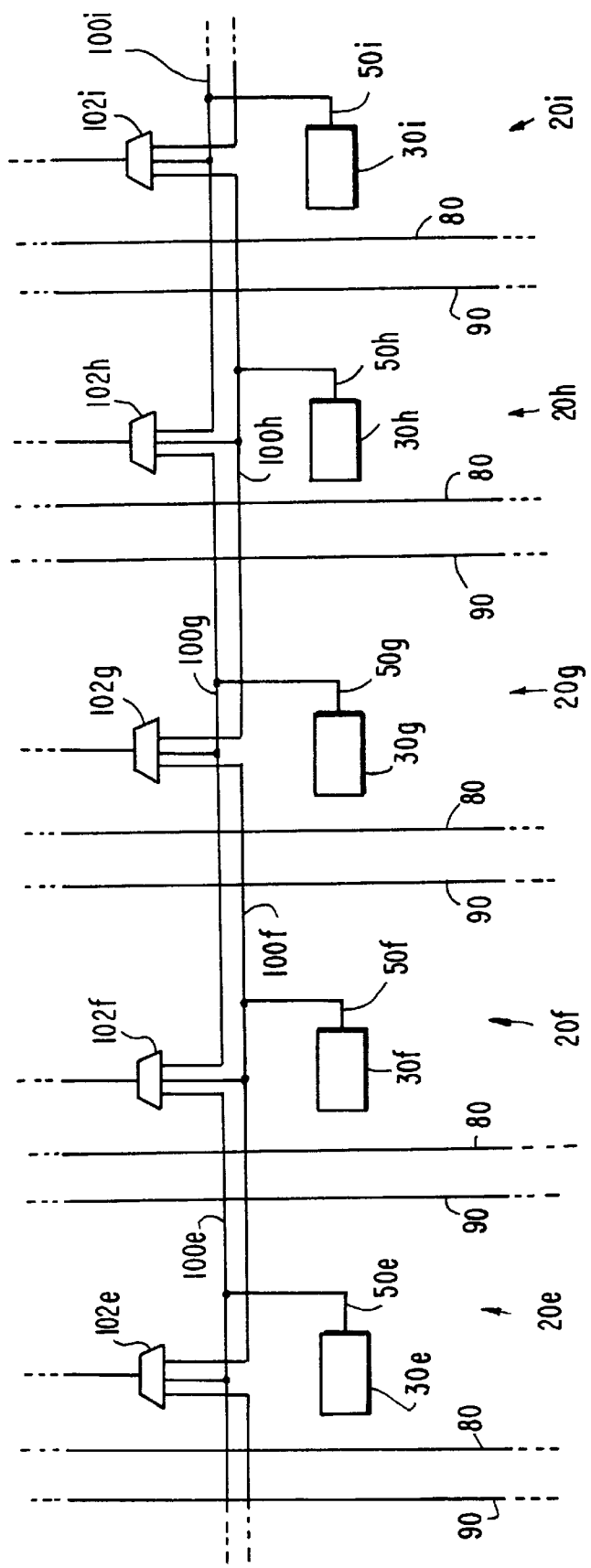
FIG. 5 is similar to a portion of FIG. 2, but shows yet another alternative embodiment of the invention.

Another alternative is to have the groups of regions 20 overlap by having different conductors 100 overlap one another. An example of this is shown in FIG. 5. In this embodiment the output signal 50 of each subregion 30 is applied to a conductor 100 which extends to the region 20 to the left and the region 20 to the right of the region that includes that subregion. For example, the output signal 50g of subregion 30g is applied to conductor 100g which extends to the PLCs 102f and 102h associated with regions 20f and 20h, as well as to PLC 102g associated with region 20g.

If desired, the type of construction shown in FIG. 5 can be extended as shown in FIG. 3 to have the conductors 100 that serve a region also programmably connectable (as by PLCs 104 in FIG. 3) to the region-feeding conductors 90 associated with that region.

Then if further desired, dedicated local feedback conductors 60 can also be eliminated. As in the embodiments (FIGS. 1–4) in which conductors 100 extend to mutually exclusive groups of regions 20, any level of segmentation can be used in embodiments (like FIG. 5) in which conductors 100 are arranged to produce overlapping groups of regions 20. In other words, each conductor 100 can extend to more than three regions 20 (e.g., to four or five such regions) if desired. It will be appreciated that FIG. 5 is simplified (as compared, for example, to FIG. 2) by omitting depiction of elements that are not essential for an explanation of the feature illustrated by FIG. 5.

The embodiment shown in FIG. 6 (which may have additional details as shown in any of FIGS. 1–5 or in other FIGS. to be described below) shows the possible addition of PLCs 84 between the vertical conductors 80 associated with each column of regions 20 and the region-feeding conductors 90 associated with each region 20 in that column. The provision of such PLCs 84 reduces or eliminates the need to use horizontal conductors 70 to make connections from the vertical conductors 80 in a column to the region-feeding conductors 90 in that column. This conserves horizontal conductor 70 resources for use in making longer-distance horizontal connections. Only a partial population of PLCs 84 is preferably needed (i.e., it is preferably sufficient to provide only enough PLCs 84 so that each vertical conductor 80 is connectable to a subset of the region-feeding conductors 90 in each group of conductors 90).

Several possible ways of providing PLCs 84 are shown in FIGS. 7a–7d. All of these FIGS. assume a structure like that shown in FIGS. 13 and 14 (described in more detail below) in which one set of conductors 60/90 provides the functions of (1) local feedback like previously described conductors 60, (2) region feeding like previously described conductors 90, and (3) driving out to adjacent conductors 70 and 80. Programmable bi-directional connections between conductors 70 and 60/90 are represented in FIGS. 7a–7d by PLCs 72'. Also in these FIGS. each subregion output 50 is shown with a gating PLC 52 such as a programmably controlled pass transistor or other PLC device.

Figure 7A:
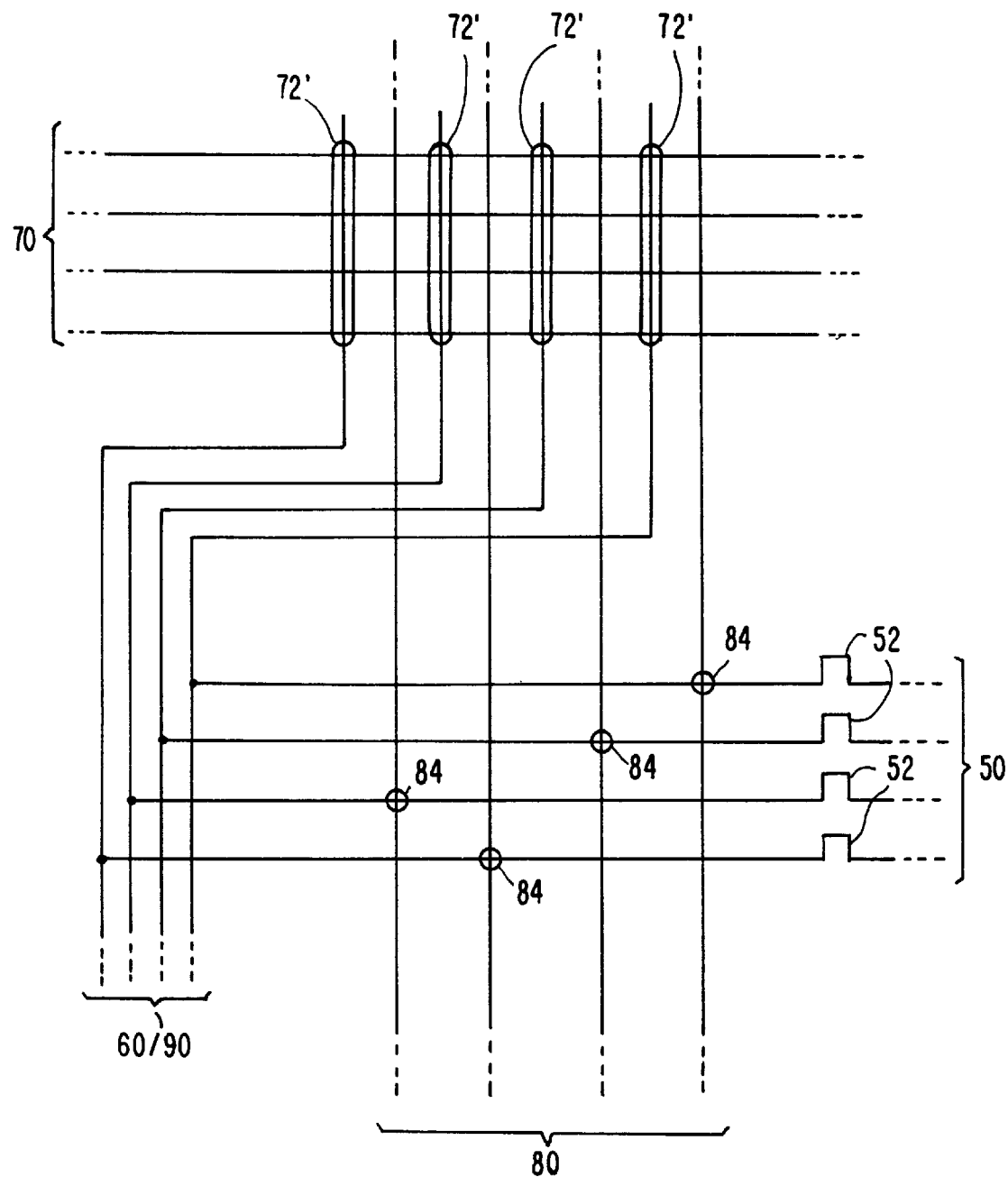
FIG. 7a is a simplified schematic block diagram showing an illustrative way in which the feature of FIG. 6 can be provided.
Figure 7C:
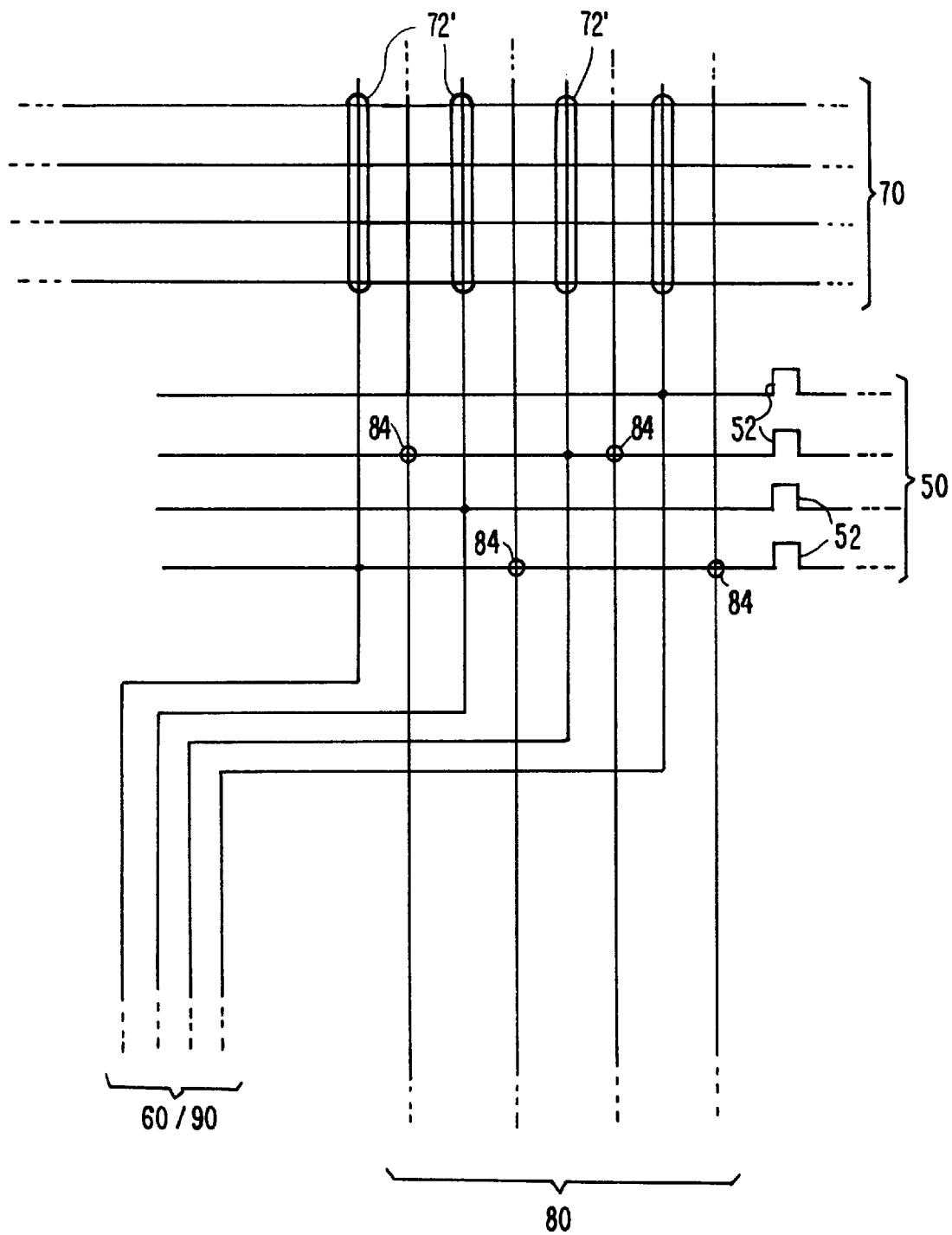
FIG. 7c is also similar to FIG. 7a, but shows still another illustrative way of providing the feature of FIG. 6.

In FIG. 7a PLCs 84 are provided between conductors 80 and segments of conductors 50 extending from PLCs 52 to conductors 60/90. In FIG. 7b PLCs 84 are provided between conductors 80 and 60/90. In FIG. 7c PLCs 84 are connected between conductors 80 and only selected ones of conductors 50. In other words, some conductors 50 have more than one PLC 84, while other conductors 50 have no PLCs 84. In FIG. 7d horizontal branches 80' of conductors 80 are included, and PLCs 84 are provided between these branches and conductors 60/90.

FIG. 8 shows another possible feature in accordance with this invention. Embodiments of the type shown in FIG. 8 may additionally have any of the features shown in the above-described FIGS. In FIG. 8 each vertical conductor 80 is divided into upper and lower segments 80a and 80b, which are programmably interconnectable, when needed, by PLCs 86 (e.g., pass transistors). If a connection is needed between two upper rows only, an upper segment 80a can be used to make that connection, leaving the associated lower segment 80b free for use in making a connection between two lower rows. On the other hand, if a connection is needed between upper and lower rows, then the upper and lower segments 80a and 80b of a vertical conductor are connected by the associated PLC 86 in order to provide that connection. This may make it possible to reduce the number of vertical conductor tracks that have to be provided in order to provide a given amount of vertical interconnectivity. In connection with the feature illustrated by FIG. 8, see also McClintock et al. U.S. Pat. No. 5,614,840, which is incorporated by reference herein.

Figure 9:
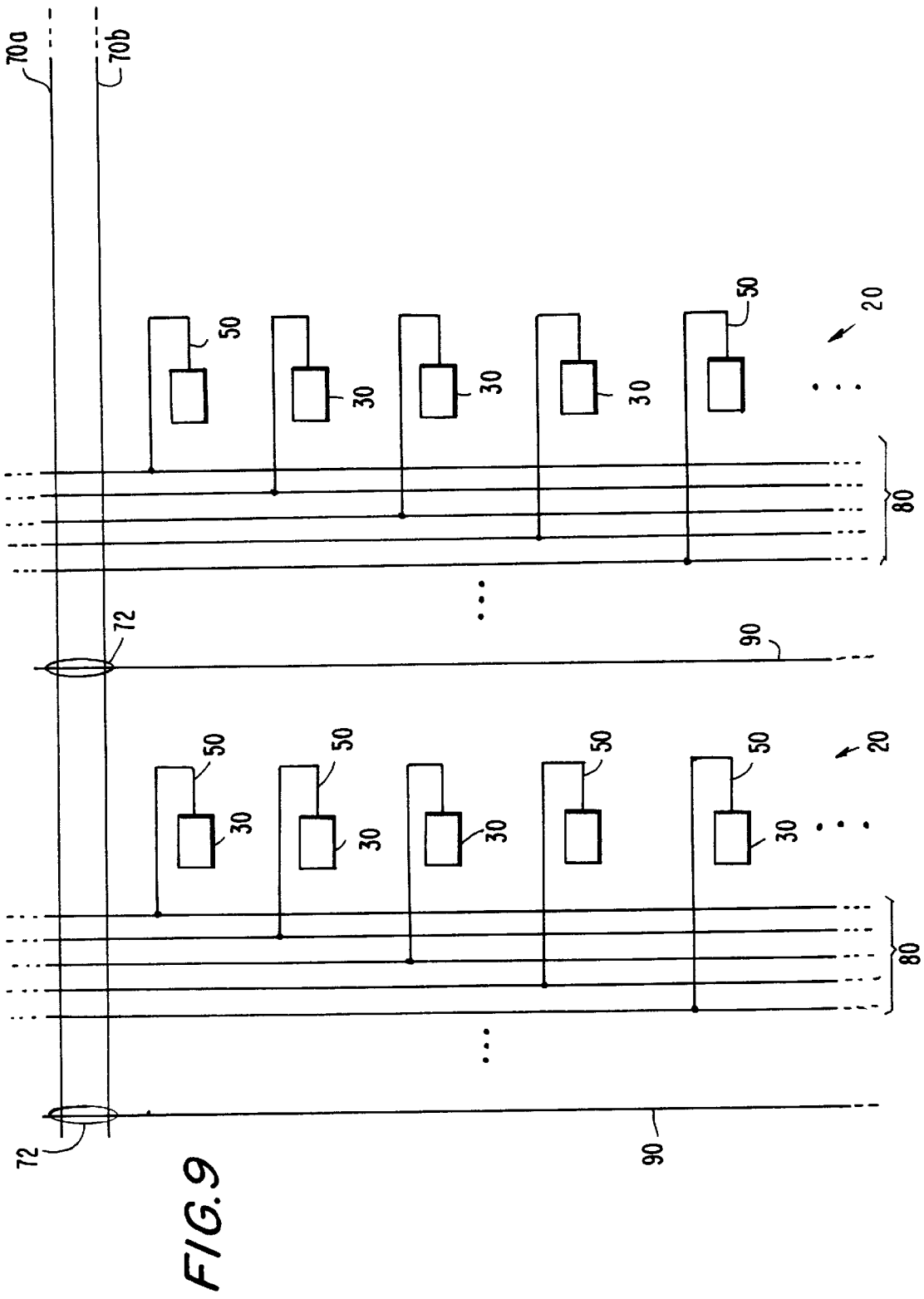
FIG. 9 is a simplified schematic block diagram of a representative portion of another illustrative embodiment of a device constructed in accordance with the invention.

In a device with a sufficiently small number of rows, it may be economical to provide each subregion output 50 with its own dedicated vertical conductor 80 as shown, for example, in FIG. 9. As an illustration of this, if each region 20 includes eight subregions 30, and the device has only two rows, 16 vertical conductors 80 associated with each column are sufficient to provide each subregion output 50 with its own vertical conductor 80. Assuming the same number of subregions 30 per region and three rows, 24 vertical conductors 80 per column are sufficient to give each subregion output 50 its own vertical conductor 80. This eliminates the need for elements such as 130 and 140 in FIG. 1. Because the vertical conductors 80 are not shared by more than one possible input, there is no need for tri-state drivers on the inputs.

Cliff et al. U.S. Pat. 5,689,195 shows programmable logic array integrated circuit devices having several columns of programmable logic regions which may be similar to regions 20 herein. In addition, the just-mentioned Cliff et al. devices include a column of regions of random access memory ("RAM") that are usable by the user of the device. The just-mentioned Cliff et al. devices do not include GH to GV connections for the GV conductors associated with the column of RAM regions. Moreover, it has been found that the GV conductors associated with the RAM column are relatively lightly used. In accordance with the present invention, a programmable logic array integrated circuit device that has a column of RAM regions is provided with GH to GV connections for the GV conductors of the RAM region column. This is illustrated by FIG. 10, which will now be discussed.

Figure 10:
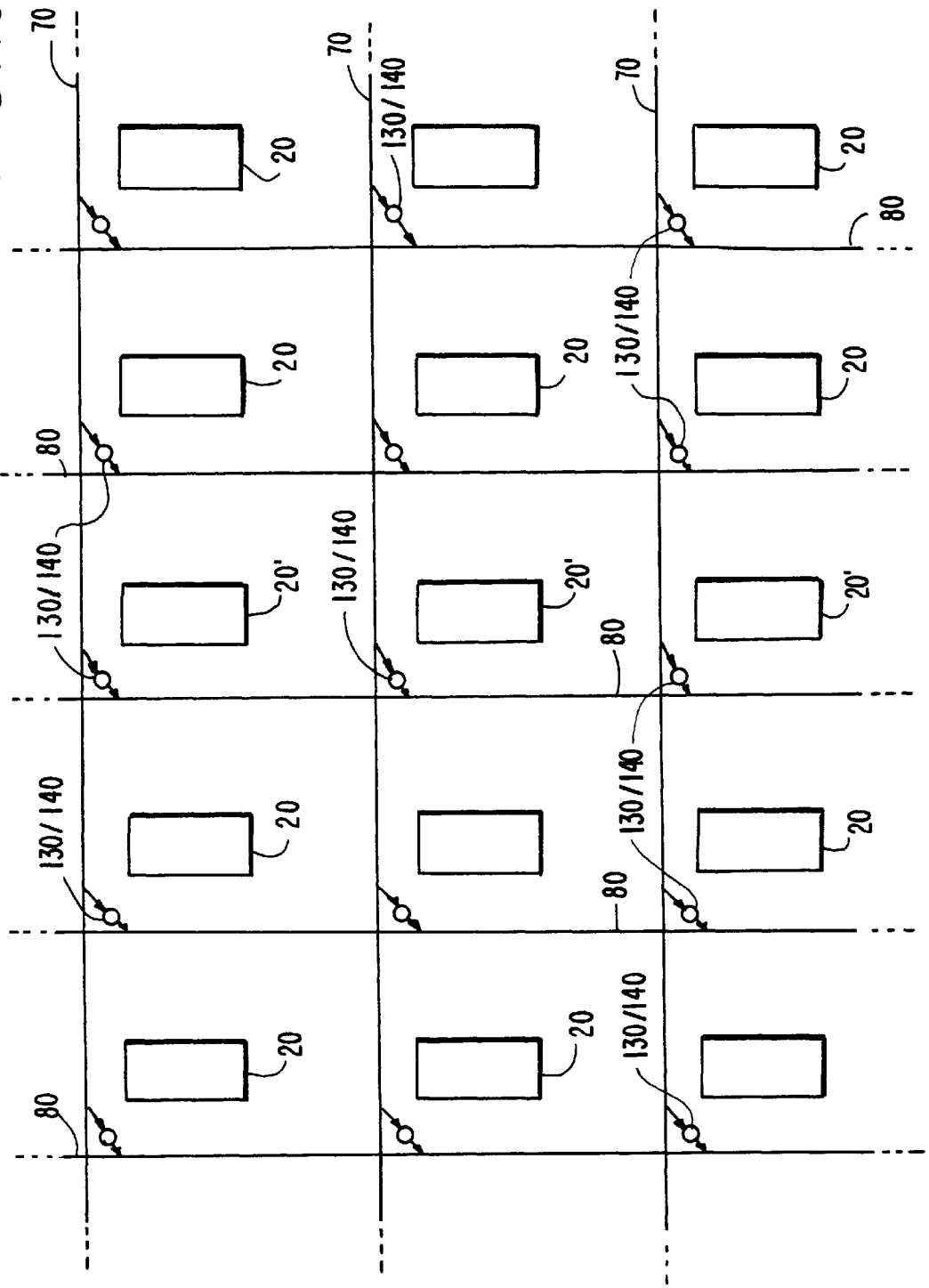
FIG. 10 is a simplified schematic block diagram of a representative portion of yet another illustrative embodiment of a device constructed in accordance with the invention.

In FIG. 10 the center column is a column of RAM regions 20', which is therefore different from the other columns of regions 20 of the type that have been described in connection with the other FIGS. herein. In accordance with the present invention, GH-to-GV PLCs 130/140 are provided for conductors 80 associated with the RAM column (regions 20'), just as similar GH-to-GV PLCs are provided for the other columns. These additional GH-to-GV PLCs 130/140 in the RAM column provide additional ways for subregion outputs 50 of regions 20 to get to different rows.

Figure 11:
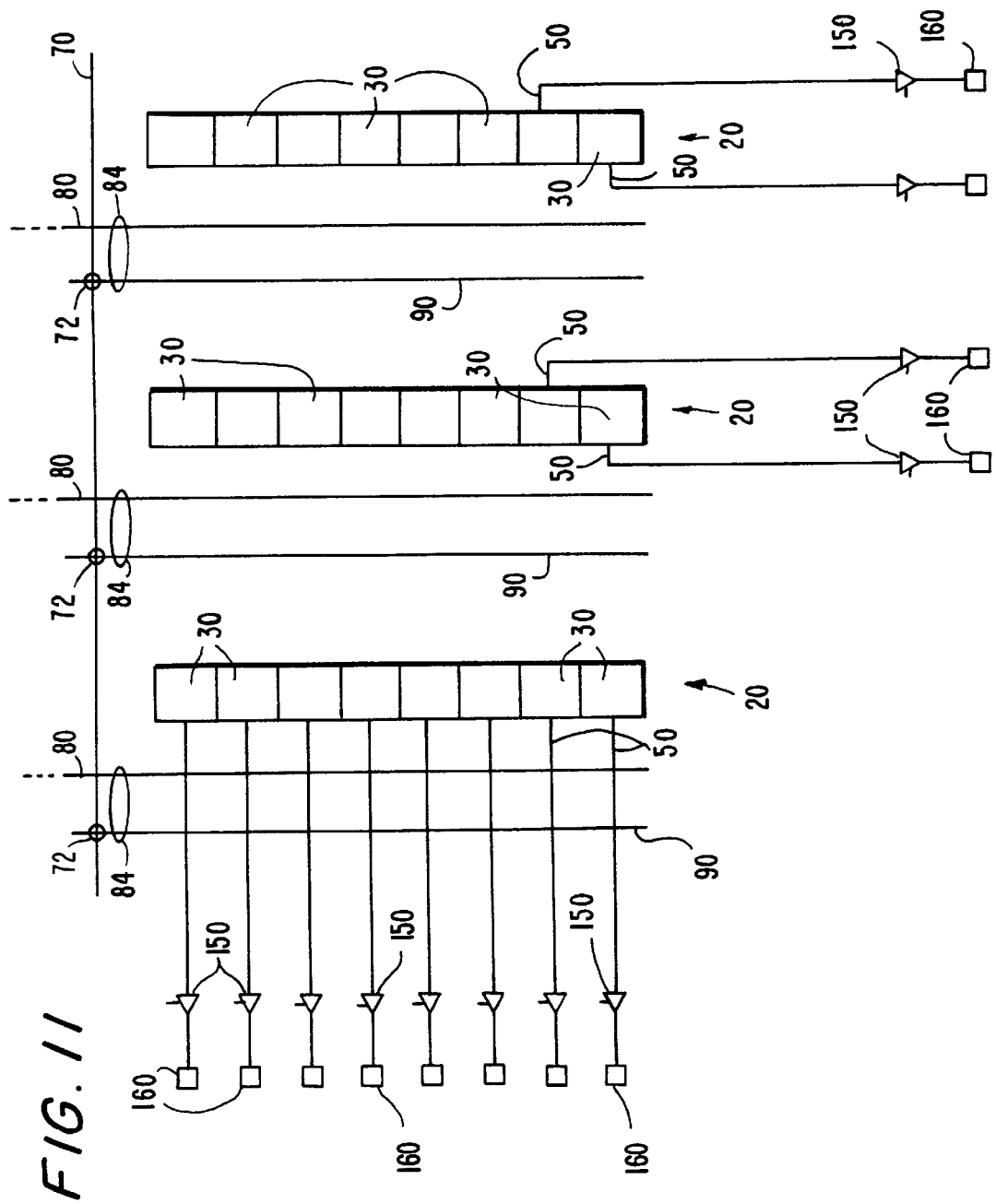
FIG. 11 is a simplified schematic block diagram of a representative portion of still another illustrative embodiment of a device constructed in accordance with the invention.

Another possible feature of the present devices is shown in FIG. 11. In accordance with this feature, all I/O cells 160 are driven by particular subregions 30 in the regions 20 around the periphery of the device. When connecting to an I/O cell 160 configured as an output, the intended output signal is routed to (or possibly produced in) the subregion 30 associated with that I/O cell. All output register functions for that I/O cell 160 are supported within its driving subregion 30. For example, an output register would be implemented in that subregion 30 with appropriate clocks, clears, and clock enables. A tri-state driver 150 is connected in series between each I/O cell 160 and its associated subregion 30. An input register for an I/O cell 160 can be implemented anywhere on the chip. The I/Os may drive into the device in the same way that they do, for example, in Cliff et al. U.S. Pat. No. 5,260,611 and Cliff et al.

U.S. Pat. No. 5,689,195. For example, each I/O along a side edge of the device may drive onto two nearby GH and/or HH conductors 70. Each I/O along a top or bottom edge of the device may drive onto two nearby GV conductors 80. In connection with the feature illustrated by FIG. 11, see also Huang et al. U.S. Pat. No. 5,764,080, which is incorporated by reference herein.

Figure 12:
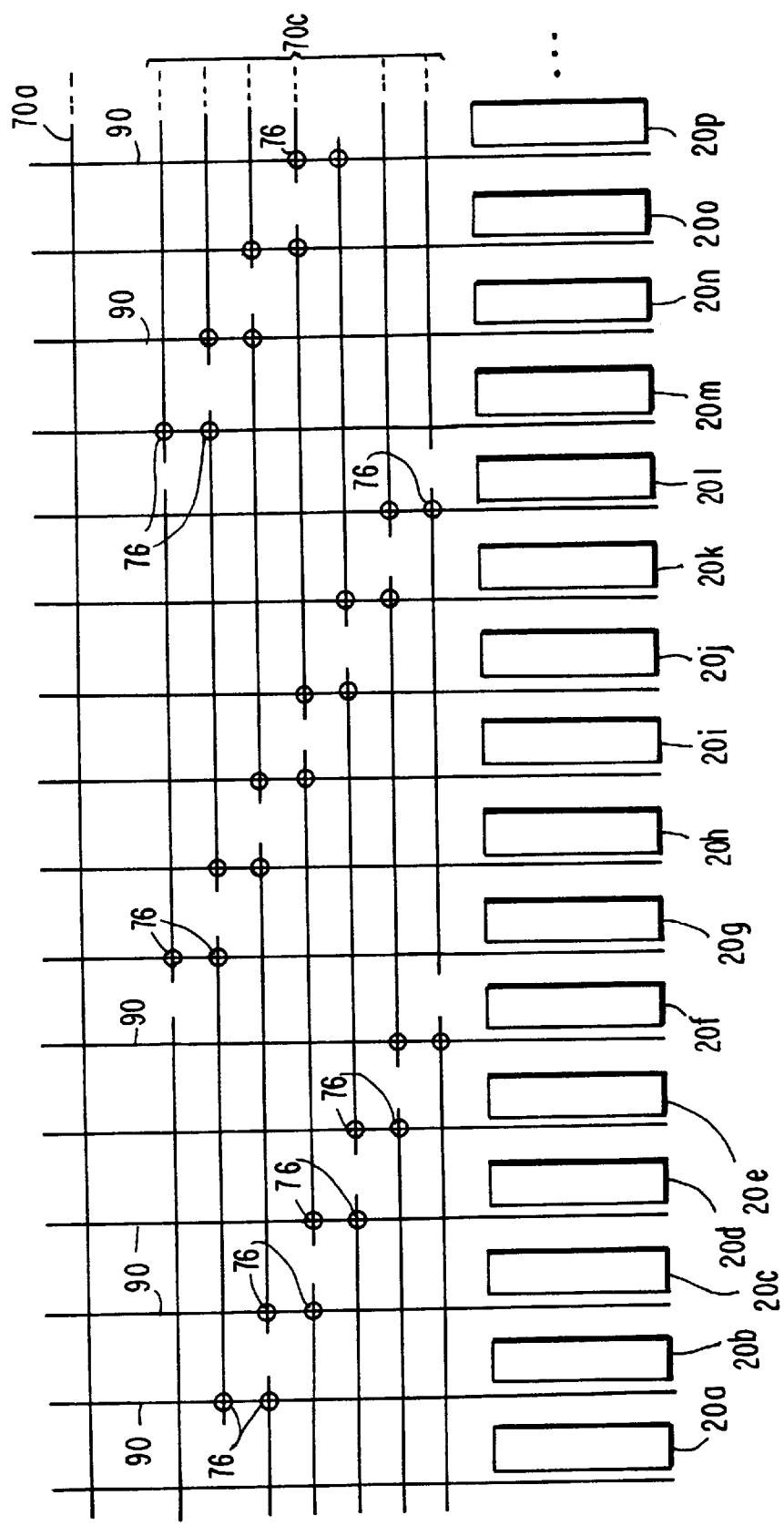
FIG. 12 is a simplified schematic block diagram of a representative portion of yet another illustrative embodiment of a device constructed in accordance with the invention.

Still another possible feature of devices constructed in accordance with this invention is shown in FIG. 12. This FIG. shows certain aspects of a representative portion of one representative row of an illustrative device. As shown in FIG. 12 each row of regions 20 is served by a plurality of GH conductors 70a and a plurality of shorter horizontal conductors 70c whose spans are staggered along the length of the row. For example, each conductor 70c may nominally extend one quarter of the length of the associated row. Conductors 70c are therefore sometimes referred to as quarter horizontal ("QH") conductors. Thus, on the assumption that there are 24 regions 20 in the row, each conductor 70c extends adjacent to six regions. Moreover, the starting (and ending) points for the various conductors 70c are staggered. Thus there is one depicted conductor 70c which starts above region 20b and extends to the right five more regions to end above region 20g. Similarly, there is another depicted conductor 70c which starts above region 20c and extends to the right five more regions to end above region 20h.

As in earlier-described embodiments, a plurality of block-feeding conductors 90 serves each block 20 by being programmably connectable to the conductors 70a and 70c intersected by that group of conductors 90. For the most part the PLCs that provide these conductor-70-to-conductor-90 connections are not shown in FIG. 12, but they are like the PLCs 72 shown in the previously discussed FIGS. Certain of these PLCs are, however, shown in FIG. 12, and these PLCs are labeled 76 to emphasize them and to identify them as preferably bi-directional connections between conductors 70c and conductors 90. PLCs 76 will now be described in more detail.

Each of conductors 70c has a PLC 76 adjacent each of its ends. Each of PLCs 76 bi-directionally connects to the same conductor 90 that also has a PLC 76 connection to another conductor 70c. The conductors 90 with these PLCs 76 can therefore be used to bi-directionally connect conductors 70c to one another to make longer horizontal conductors from two or more relatively short QH conductors 70c. PLCs 76 can, of course, also be used to apply signals on conductors 70c to conductors 90 for feeding to the associated regions 20.

As an example of use of PLCs 76 to interconnect conductors 70c, if it is necessary to transmit a signal from region 20c to region 20k, the PLCs in the column that includes region 20h may be programmed to interconnect (1) the conductor 70c that extends to the right from the region 20c column and (2) the conductor 70c that extends to the right from the region 20h column. The two thus-interconnected conductors 70c can then be used to transmit a signal from the region 20c column to the region 20k column. Longer interconnections can be made through conductors 70c by connecting more than two such conductors together.

Figure 13:
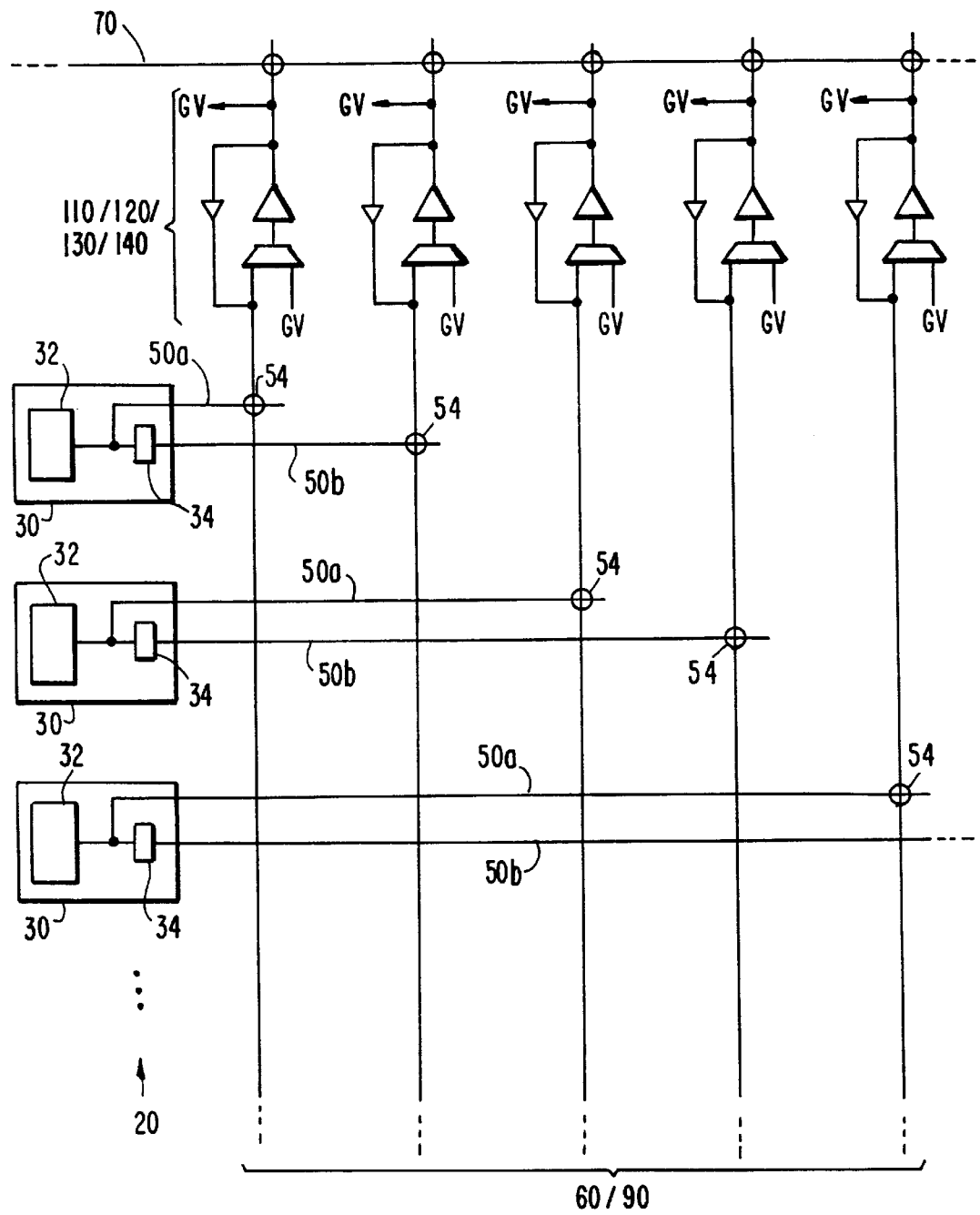
FIG. 13 is a simplified schematic block diagram of a representative portion of still another illustrative embodiment of a device constructed in accordance with the invention.
Figure 14:
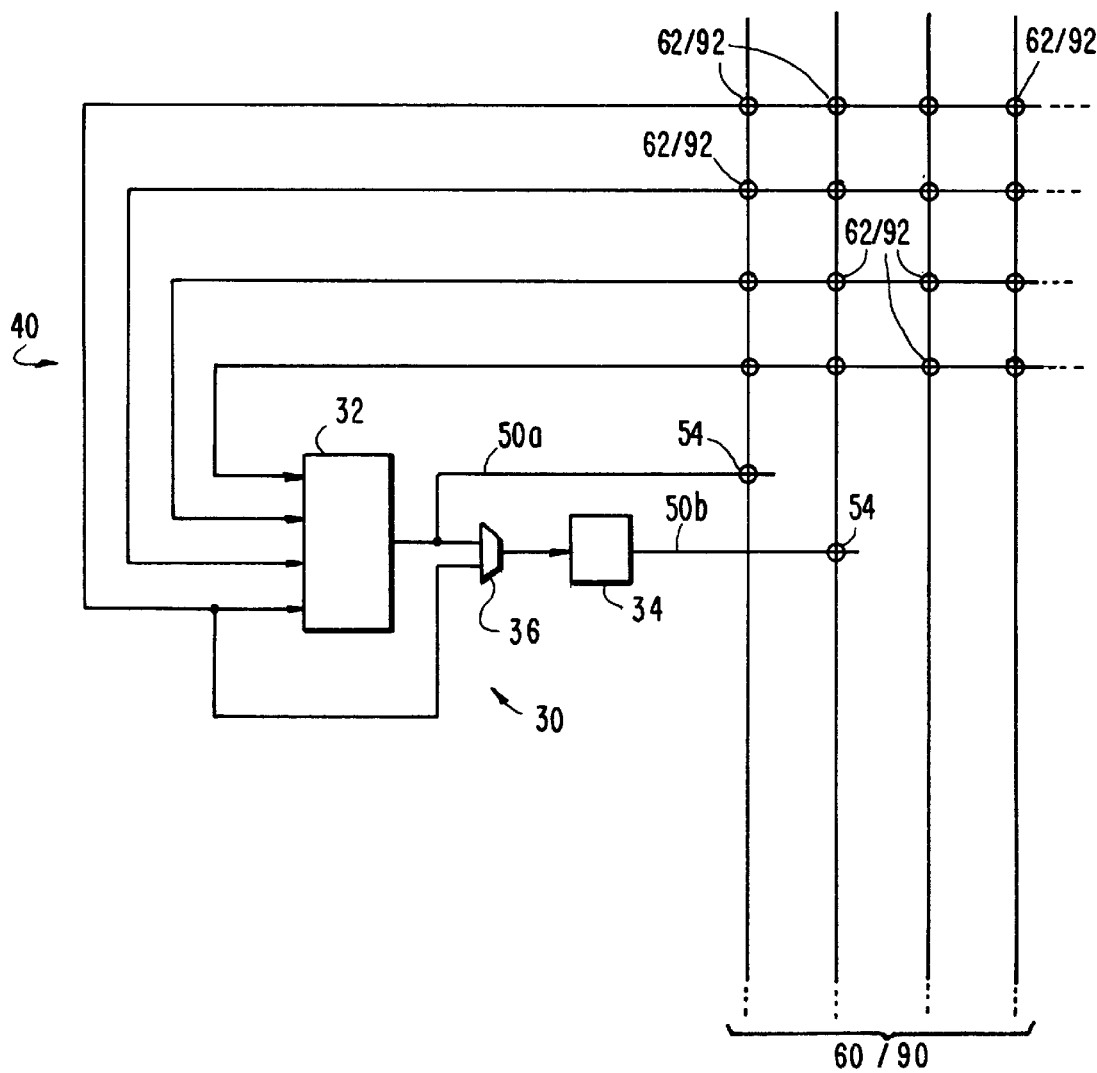
FIG. 14 is more detailed, but still simplified, schematic block diagram of a representative portion of FIG. 13.

Yet another possible feature of the present devices is illustrated by FIGS. 13 and 14. In these FIGS. the functions of conductors 60 and 90 from FIG. 1, for example, are combined in one set of dual-purpose conductors 60/90. Also the connections to, from, and between the GH (70) and GV conductors are organized somewhat differently, but the elements that provide these connections are again generally labeled 110/120/130/140 as in FIG. 1, for example. Each subregion 30 includes a look-up table portion 32 and a register (flip-flop) portion 34. As shown, for example, in FIG. 8 of Cliff et al. U.S. Pat. No. 5,689,195, each look-up table 32 may have four inputs and is programmable to produce an output signal 50a which is any logical combination of those inputs. The associated register 34 may register output signal 50a and produce a registered version as another output 50b of the subregion. Alternatively, one of the look-up table inputs 40 may bypass the look-up table via PLC 36 and be applied directly to the register 34 for registration. In that event, the subregion may substantially simultaneously perform two unrelated functions: (1) producing a combinatorial output 50a, and (2) producing a "lonely register" output 50b. In the just-mentioned Cliff et al. apparatus, one of these signals is constrained to drive locally (i.e., on a local feedback conductor), while the other of these signals is constrained to drive a global resource such as a GH or GV conductor. These constraints can limit placement of subregions that are to perform the combinatorial and lonely register functions, thereby limiting use of this device capability.

To avoid the above-mentioned constraints, the structure shown in FIGS. 13 and 14 has both the combinatorial 50a and registered 50b outputs of each subregion programmably connectable by PLCs 54 to respective conductors 60/90 that can be used either to feed subregions locally or that can be used to convey signals out to the adjacent GH and/or GV conductors. In this way both the combinatorial and registered output signals of each subregion 30 can be used either locally, or globally, or both locally and globally.

Figure 15:
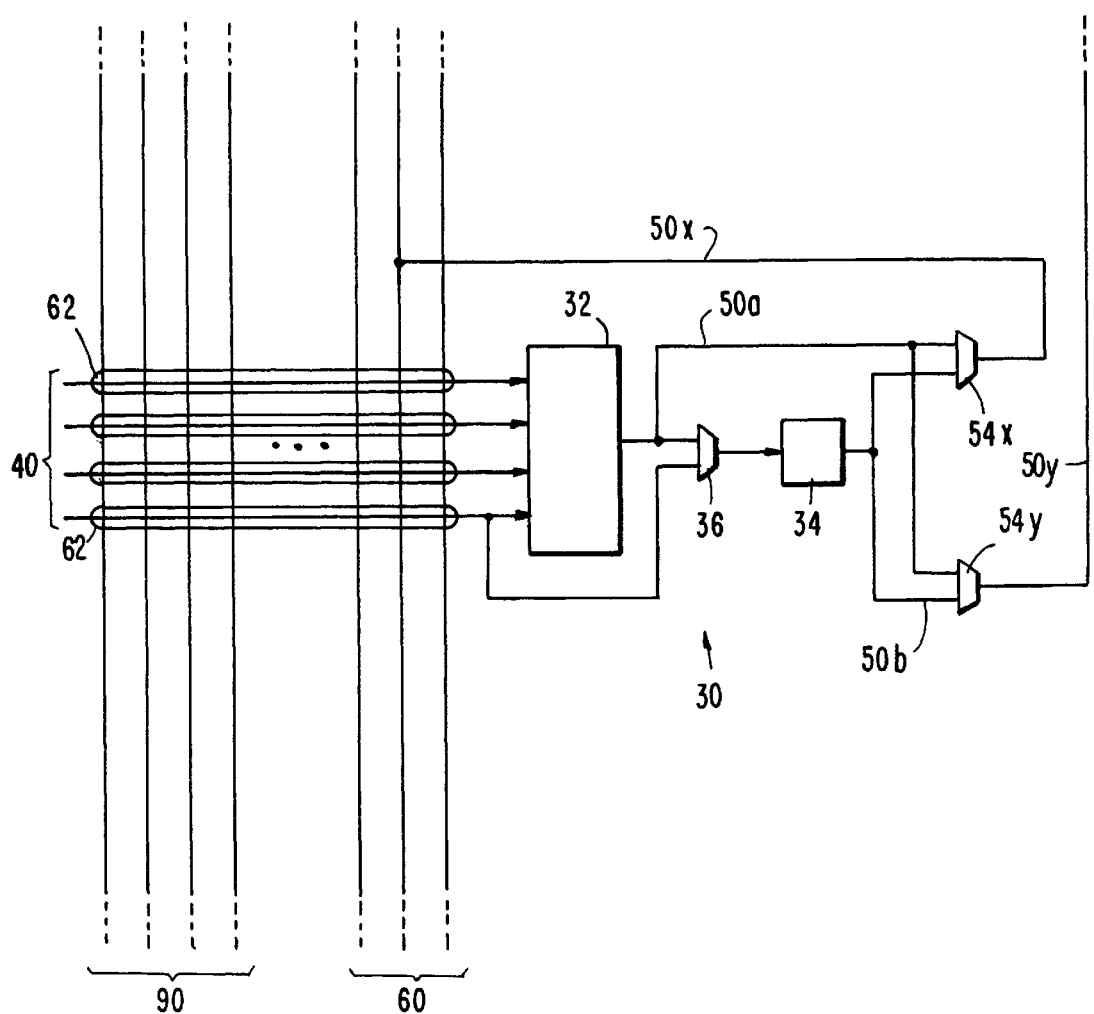
FIG. 15 is a simplified schematic block diagram of another illustrative implementation of the feature shown in FIGS. 13 and 14.

FIG. 15 shows use of the feature shown in FIGS. 13 and 14 in an embodiment in which separate or dedicated region-feeding conductors 90, local feedback conductors 60, and more global output conductors 50y are provided for subregions 30. For example, output conductors 50y may be connected to conductors like 100 in FIG. 1 or they may drive more directly to conductors 70 and/or 80 as in above-mentioned Cliff et al. U.S. Pat. No. 5,689,195. PLC 54x can apply either the combinatorial output 50a or the registered output 50b of subregion 30 to the local feedback conductor 60 of that subregion. Similarly, PLC 54y can apply either the combinatorial output 50a or the registered output 50b of subregion 30 to the more global output conductor 50y of the subregion.

In connection with the feature illustrated in FIGS. 13–15, see also Cliff et al. U.S. Pat. No. 5,909,126, which is hereby incorporated by reference herein.

PLCs such as 62, 72, 92, 110, 120, 130, and 140 in FIG. 1 and other programmable connections described throughout this specification can be implemented in any of a wide variety of ways. For example, each PLC can be a relatively simple programmable connector such as a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic implementing functions such as AND, NAND, OR, or NOR. Examples of components suitable for implementing PLCs are EPROMs, EEPROMs, pass transistors, transmission gates, antifuses, laser fuses, metal optional links, etc. The components of PLCs can be controlled by various function control elements ("FCEs") as described in more detail below (although with certain PLC implementations (e.g., fuses and metal optional links) separate FCE devices are not required).

FCEs (such as the programmable elements that control the PLCs and programmable logic shown throughout the drawings) can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like.

It will be understood that the foregoing is only illustrative of the principles of the invention, and that various modifications can be made by those skilled in the art without departing from the scope and spirit of the invention. For example, various technologies can be used to provide the programmable logic and control as has been mentioned. Parameters such as the number of subregions in a region, the number of regions, the numbers of rows and columns of regions, the numbers of the various types of interconnection conductors, the densities of the populations of programmable connections between various kinds of conductors, etc., can all be varied as desired. Directional or orientational terms such as "horizontal"/"vertical", "row"/"column", "up"/"down", "left"/"right", etc., are selected for use herein arbitrarily and purely for convenience. No fixed or absolute directions or orientations are intended, and the members of these various pairs of terms can be reversed if desired. Terms such as "region" and "subregion" are also arbitrary relative terms, and the term "region" may sometimes be used herein and in the appended claims for what is elsewhere sometimes referred to as a "subregion".

The invention claimed is:

1. A programmable logic device comprising:
    a plurality of regions of programmable logic disposed on the device in a two-dimensional array of intersecting rows and columns of the regions, each of the regions including a plurality of subregions of programmable logic;
    a plurality of interconnection conductors extending parallel to each of the rows;
    driver circuitry associated with each of the interconnection conductors and adapted to drive an applied signal onto the associated interconnection conductor; and
    selection circuitry associated with each driver circuitry and adapted to select an output signal of any one of at least three of the subregions that are respectively located in three of the columns that are adjacent to one another as the signal applied to the associated driver circuitry.

2. The programmable logic device defined in claim 1 further comprising:
    a plurality of second interconnection conductors extending parallel to each of the columns;
    second driver circuitry associated with each of the second interconnection conductors and adapted to drive a second applied signal onto the associated second interconnection conductor; and
    second selection circuitry associated with each second driver circuitry and adapted to select an output signal of any one of the at least three subregions as the second signal applied to the associated second driver circuitry.

3. The programmable logic device defined in claim 2 wherein the selection circuitry associated with each driver circuitry is further adapted to alternatively select a signal from one of the second interconnection conductors as the signal applied to the associated driver circuitry.

4. The programmable logic device defined in claim 3 wherein the second selection circuitry associated with each second driver circuitry is further adapted to alternatively select a signal from one of the interconnection conductors as the second signal applied to the associated second driver circuitry.

5. The programmable logic device defined in claim 1 further comprising a plurality of region-feeding conductors associated with each of the regions and adapted to supply signals from the interconnection conductors associated with the row that includes that region to that region; and
    programmable connections between each selection circuitry and the region-feeding conductors associated with the regions that include the at least three subregions from which that selection circuitry can select an output signal.

6. The programmable logic device defined in claim 2 wherein at least some of the second interconnection conductors are programmably segmentable so that each segment can convey a signal only between an associated subplurality of the rows.

7. A programmable logic device comprising:
    a plurality of regions of programmable logic disposed on the device in a two-dimensional array of intersecting rows and columns of the regions, each of the regions including a plurality of subregions of programmable logic, the regions in each row being associated with a multiplicity of subpluralities of the regions in that row, each subplurality including at least three regions;
    an output signal conductor associated with each of the subregions, each output conductor extending adjacent to each of the regions in the subplurality that includes the region including that subregion;
    selection circuitry associated with each region and adapted to select as an output signal the signal on any one of an associated plurality of the output signal conductors, which plurality includes one output signal conductor associated with a subregion in each region in the subplurality that includes the region associated with that selection circuitry;
    a plurality of interconnection conductors associated with each of the rows and adapted to convey signals between the regions in the associated row; and
    driver circuitry associated with each selection circuitry and adapted to apply the output signal of that selection circuitry to an interconnection conductor associated with the row that includes the region associated with that selection circuitry.

8. The programmable logic device defined in claim 7 further comprising;
    a plurality of second interconnection conductors associated with each of the columns and adapted to convey signals along the associated column;
    second selection circuitry associated with each selection circuitry and adapted to select as a second output signal the signal on any of the output signal conductors that the selection circuitry can select the output signal from; and
    second driver circuitry associated with each second selection circuitry and adapted to apply the second output signal of that second selection circuitry to a second interconnection conductor associated with the column that includes the region associated with the selection circuitry with which that second selection circuitry is associated.

9. The programmable logic device defined in claims 8 wherein the selection circuitry associated with each region is further adapted to alternatively select the output signal from a second interconnection conductor associated with the column that includes that region.

10. The programmable logic device defined in claim 8 wherein the second selection circuitry associated with the selection circuitry associated with each region is further adapted to alternatively select the output signal from an interconnection conductor associated with the row that includes that region.

11. The programmable logic device defined in claim 7 further comprising:
    region-feeding conductors associated with each region and adapted to supply input signals to the subregions in that region;

first programmable connections between the region-feeding conductors associated with each region and the interconnection conductors associated with the row that includes that region; and second programmable connections between the output signal conductors from which the selection circuitry associated with each region can select the output signal and the region-feeding conductors associated with that region.

12. The programmable logic device defined in claim 8 wherein at least some of the second interconnection conductors are programmable segmentable so that each segment can convey a signal only between an associated subplurality of the rows.

13. A programmable logic device comprising:

a plurality of regions of programmable logic disposed on the device in a plurality of rows of the regions, each region in each row being associated with a plurality of subpluralities of adjacent ones of the regions in that row, each of the subpluralities that each region is associated with including a different number of the regions to at least one side of that region;

at least one interconnection conductor associated with each of the subpluralities and adapted to convey signals between the regions in that subplurality;

region-feeding conductors associated with each of the regions and adapted to supply input signals to the associated region; and programmable connections between the region-feeding conductors associated with each region and the interconnection conductors associated with the subpluralities that include that region and adapted to allow at least some of those interconnection conductors to be connected to one another via those region-feeding conductors.

14. The programmable logic device defined in claim 13 wherein each of the subpluralities includes at least three of the regions.

15. The programmable logic device defined in claim 13 further comprising:

a plurality of second interconnection conductors associated with each of the rows and adapted to convey signals between any of the regions in the associated row; and second programmable connections between the region-feeding conductors associated with each region and the second interconnection conductors associated with the row that includes that region.

16. The programmable logic device defined in claim 15 wherein the regions are additionally disposed on the device in a plurality of columns that intersect the rows, and wherein the device further comprises:

a plurality of third interconnection conductors associated with each of the columns, each of the third interconnection conductors being programmably segmentable into a plurality of segments, each of which is adapted to convey a signal between only an associated subplurality of the rows.

* * * * *